United States Patent [19]

Frosien et al.

[11] Patent Number: 4,577,147
[45] Date of Patent: Mar. 18, 1986

[54] ARRANGEMENT AND METHOD FOR VOLTAGE MEASUREMENT AT A BURIED TEST SUBJECT

[75] Inventors: Jürgen Frosien, Ottobrunn; Michael Pomper, Schliersee, both of Fed. Rep. of Germany

[73] Assignee: Siemens Aktiengesellschaft, Berlin & Munich, Fed. Rep. of Germany

[21] Appl. No.: 501,088

[22] Filed: Jun. 6, 1983

[30] Foreign Application Priority Data

Sep. 2, 1982 [DE] Fed. Rep. of Germany ....... 3232671

[51] Int. Cl.$^4$ ........................................... G01N 27/00
[52] U.S. Cl. .................................... 324/71.3; 250/311
[58] Field of Search ............... 324/149, 158 T, 158 D, 324/71.3, 71.6, 73 PC, 158 R; 357/85; 250/398, 399, 310, 311 (U.S. only), 492.2 (U.S. only); 313/376, 377

[56] References Cited

U.S. PATENT DOCUMENTS

| | | | |
|---|---|---|---|
| 3,448,377 | 6/1969 | Seiwatz | 324/54 |
| 3,531,716 | 9/1970 | Tarui | 324/73 PC |
| 3,549,999 | 12/1970 | Norton | 324/158 D |
| 3,671,743 | 6/1972 | Nixon | 250/311 |
| 3,781,574 | 12/1973 | White | 307/304 |
| 3,882,391 | 5/1975 | Liles | 324/158 R |
| 4,464,627 | 8/1984 | Munakata | 324/158 D |

OTHER PUBLICATIONS

"VLSI Testing Using the Electron Probe", by H. P. Feuerbaum, Scanning Electron Microscopy, 1979, I SEM Inc., AMF, O'Hare, Illinois, pp. 285-296.
"Non-Charging Electron Beam Pulse Prober on FET Wafers", by L. Kotorman, Scanning Electron Microscopy, 1980, IV SEM, Inc., AMF, O'Hare, Chicago, Ill.-pp. 77-84.

Primary Examiner—Michael J. Tokar
Attorney, Agent, or Firm—Hill, Van Santen, Steadman & Simpson

[57] ABSTRACT

In order to permit good test results in the voltage measurement of buried test subjects, an arrangement is provided having a particle beam probe for voltage measurement at a test subject which is spatially separated from a surface by a solid state substance. The solid state substance provides mobile charges disposed in insulated fashion between said test subject and the particle beam probe. A charge separation due to the influence of the test subject potential is produced in the solid state substance so that a potential on the surface of the solid state substance immediately adjacent to the particle beam probe becomes proportional to the potential on the test subject.

7 Claims, 4 Drawing Figures

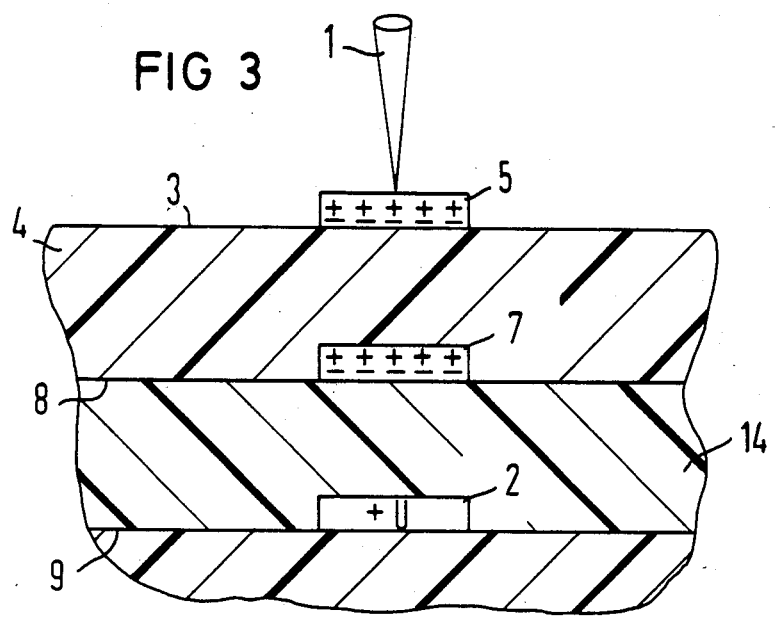
FIG 3
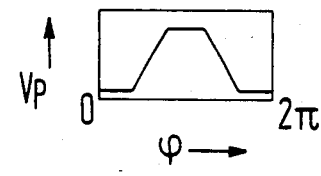
FIG 4
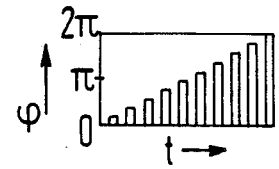
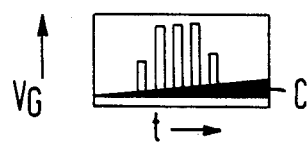
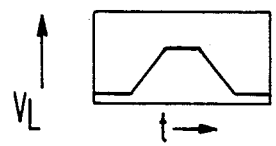

ARRANGEMENT AND METHOD FOR VOLTAGE MEASUREMENT AT A BURIED TEST SUBJECT

BACKGROUND OF THE INVENTION

The invention relates to an arrangement with a particle beam probe for voltage measurement at a test subject which is spatially separated from a surface by an insulating solid state substance.

In the past, electron beam mensuration technology has proven itself as a practical method for contact-free measurement of voltage progressions in integrated circuits (H. P. Feuerbaum, "VLSI Testing Using the Electron Probe", Scanning Electron Microscopy/1979/I, 285–296, incorporated herein by reference). The measuring principle disclosed by H. P. Feuerbaum has been applied to measuring points which are situated at the circuit surface. Given the increasing degree of integration of the circuits, however, multi-layer wirings are more and more frequently employed so that there will be a need in the future to identify the potential of tracks buried in the semiconductor chip.

According to the prior art, there is no simple and efficient measuring method for quantitative voltage measurement at buried tracks without additional processing or procedure steps at the circuit. It has been proposed by J. Frosien to bore through to the hidden tracks and to identify the potential of these tracks through the bores. Such a method, however, requires a considerable additional processing cost.

L. Kotorman, Scanning Electron Microscoph/1980/IV, pp. 77–84, incorporated herein by reference, has proposed that the potential of the buried track be capacitively identified at the surface of the insulator under which the track is buried via the electrical polarization of the insulator. In practice, such a method will probably supply only imprecise measurement results since the polarized surface of the insulator represents an extremely low-load voltage source which is determined only by the capacitance of the area on the surface of said insulator irradiated by the particle beam probe. Secondly, the voltage distribution at the surface of the insulator does not correspond to the voltage distribution of the track since this voltage distribution at the surface of the insulator is generated by an inhomogeneous electrical field.

SUMMARY OF THE INVENTION

An object of the present invention is to specify an arrangement and a method of the type initially cited which enables good measurement results in the voltage measurement of buried test subjects.

This object is achieved by providing a test spot means having mobile charges disposed in insulated fashion between the test subject and the particle beam probe. The mobile charges in the test spot means are influenced by the potential on the test subject. The particle beam probe then measures the effect on the test spot means when the mobile charges are influenced.

BRIEF DESCRIPTION OF THE DRAWINGS

FIG. 3 shows a sandwich arrangement of metallic measuring spots for capacitive coupling to deeply buried potentials according to the invention; and FIG. 4 shows the principle of voltage measurement via a phase modulation of the particle beam probe, whereby the voltage at the test subject is switched back and forth between the potential to be measured and a reference voltage.

DESCRIPTION OF THE PREFERRED EMBODIMENTS

Figure 1:
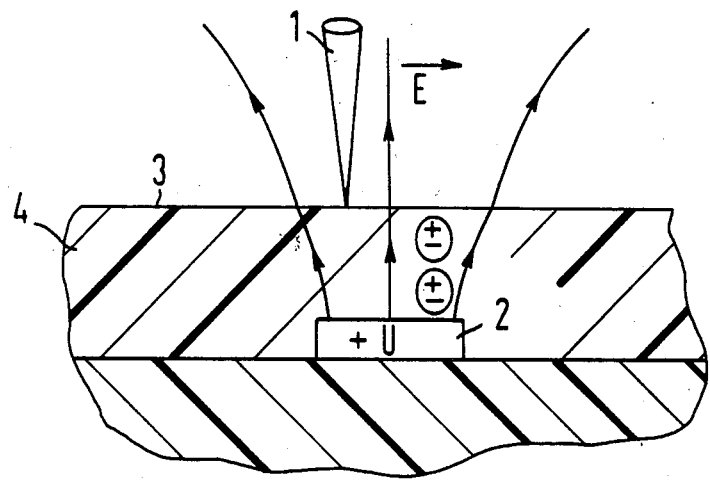
FIG. 1 shows the principle of a capacitive voltage measurement with a particle beam probe at the surface of an insulator according to the prior art.

FIG. 1 shows the principle of the capacitive voltage measurement at the surface 3 of a solid state substance represented as an insulator 4 with the assistance of a particle beam probe 1 according to Kotorman. The voltage $+U$ is present on the test subject 2, a buried track, which is spatially separated from the surface 3 by another solid state substance 4 acting as the insulator. The electric dipoles of the insulator 4 are polarized as a result of this voltage $+U$ at the test subject 2. The particle beam probe 1 is directed against a part of the surface 3 above the test subject 2. This known measuring method will probably supply only imprecise measured results in practice since first the polarized surface 3 represents an extremely low-load voltage source which is determined only by the capacitance of the sub-surface of the surface 3 irradiated by the particle beam probe 1 and since, second, the voltage distribution at the surface 3 does not correspond to the voltage distribution of the buried test subject 2 since this voltage distribution at the surface 3 is generated by an inhomogeneous electrical field $\vec{E}$.

Figure 2:
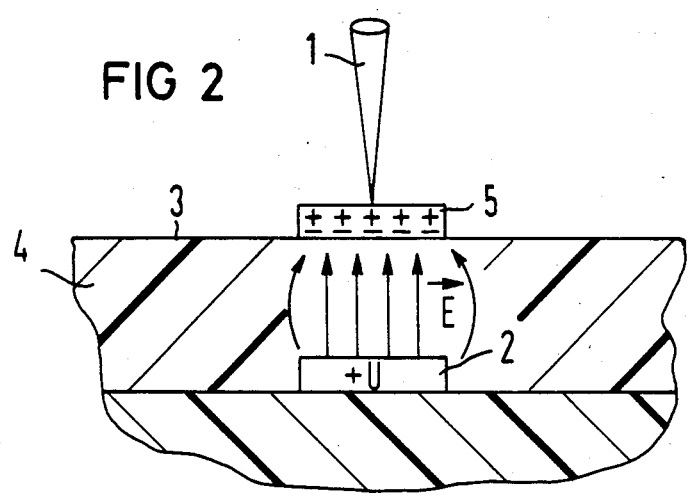
FIG. 2 shows the principle of a capacitive voltage measurement with a particle beam probe over a measuring spot applied in insulated fashion according to the invention.

FIG. 2 shows the principle of a capacitive voltage measurement via a test spot 5 in insulated fashion according to the invention. At least one solid state substance 5 which exhibits movable charges is disposed as a metallic test spot 5 between the test subject 2 and the particle beam probe 1. The metallic test spot 5 is applied to the insulator 4 above the buried test subject 2 which is a buried track in this example. The voltage $+U$ is present on the buried test subject 2. Due to the influence of this potential, a charge separation occurs at the test spot 5 applied in insulated fashion to the surface 3, so that a potential occurs at the surface of the test spot 5 which is proportional to the potential $+U$ on the buried track 2. When the edge lengths of the opposing surfaces of the buried track 2 and the test spot 5 are large in comparison to the thickness of the intervening insulator 4, then conditions exist which are similar to those in a plate capacitor. The voltage distribution at the surface of the test spot 5 facing the particle beam probe 1 approximately corresponds to the voltage distribution at the track 2 since this voltage distribution at the surface of the test spot 5 facing the particle beam probe 1 is generated by an electrical field $\vec{E}$ which is approximately homogeneous. The potential at the surface of the test spot 5 facing the particle beam probe 1 then corresponds to the potential $+U$ at the buried track 2. The potential at the surface of the test spot 5 facing the particle beam probe 1 can now be identified with the known methods of electron beam mensuration technology. Since the test spot 5 can be charged or discharged by the scanning primary particle beam 1 during the potential measurement, the charge curve of the capacitor consisting of test subject 2 and test spot 5 can superimpose on the potential to be measured. In order to keep this side effect as small as possible, first the capacitance of the arrangement consisting of the test subject 2 and the test spot 5 must be sufficiently large so that the additional noise voltage building up during the measurement remains sufficiently small. This can be achieved by means of a corresponding size of the test spot 5, and/or the energy of the primary particle beam 1 must be selected such that the sum of backscatter particles and secondary particles is equal to the sum of primary electrons striking the surface of the test spot 5. Then, the test spot 5 does not charge. The measurement thus occurs in a load-free manner.

When these two latter conditions for minimizing the additional noise voltage building up during the measurement cannot be sufficiently met, then the method of phase modulation of the particle beam probe 1 must be additionally applied, as is known from page 292 of the publication by H. P. Feuerbaum incorporated herein by reference and is described in greater detail in a way well known to those skilled in this art below with reference to FIG. 4 (see also U.S. Pat. No. 4,220,854).

FIG. 3 shows a sandwich arrangement of metallic test spots 5, 7 for capacitive coupling of deeply buried potentials. The potential +U applied to the buried test subject 2, again a buried track in the example, produces a charge separation due to influence on the test spot 7 disposed in insulated fashion, said charge separation in turn again effecting a charge separation at the test spot 5 applied in insulated fashion. The auxiliary metallic spot 7 for capacitive coupling is disposed in the intermediate level 8 between the insulators 4 and 14. When the potential +U at very deeply buried test subjects 2 is to be identified, for example on the third metallization plane 9 or on metallization planes which lie even deeper, then further metallic auxiliary spots applied in the intermediate planes 8 increase the capacitive coupling between the test subject 2 and the metallic test spot 5 and facilitate the measurement.

A method extracted from said publication by H. P. Feuerbaum is explained on the basis of FIG. 4 which corresponds to FIG. 10 in the cited publication. The additional voltage building up during the measurement at the surface of the test spot 5 facing the particle beam probe 1 can be eliminated from the test result with the assistance of this method. Given this so-called method of phase skip or of phase modulation, the voltage at the test subject 2 is switched back and forth between the potential to be measured and a reference voltage. Let the reference voltage thereby amount, for example, to 0 volts. A period of a voltage $V_P$ at the test subject 2 to be measured is illustrated by way of example in FIG. 4. When scanning the waveform of this voltage $V_P$, the phase $\phi$ of the particle beam probe 1 is not continuously varied as usual, but rather in skip-wise fashion. The particle beam probe 1 thereby alternately strikes the surface of the test spot 5 with a discontinuously increased phase $\phi$ on the one hand and then with a reference phase which is shown in FIG. 4 with $\phi = 0$. The system for processing the secondary particle signals measures the voltage $V_G$ during the discontinuously increased phase and during the reference phase, and then supplies the difference of these voltages $V_G$ as the measured result. Due to the phase modulation of the particle beam probe 1, the voltage $V_G$ contains an ac voltage component. This ac voltage component can be detected with the assistance of a lock-in amplifier well known to those skilled in this art, and can be integrated over a plurality of phases of the particle beam probe. As a result of this procedure, the voltage $V_L$, is obtained which is uninfluenced by disturbances and which is identical to the voltage $V_P$ to be measured.

With the method according to FIG. 4, a phase modulation is employed in which the phase of the primary electron pulses is altered not continuously but incrementally. In this manner the primary electrons impinge on the measuring point alternately once following an incremental increase of the phase and once during the reference phase. The secondary electron signal processing system measures the voltage then once in the case of a phase which has just increased incrementally and subsequently again in the case of the reference phase and delivers the difference of the two thus obtained values as the measurement result. On account of the chronological variation of the output signal of the signal processing unit, this output signal contains an AC voltage component whose amplitude corresponds to the voltage variation between the respectively successive phases. This AC voltage component of the output signal can be ascertained with a lock-in amplifier and yields, following a measurement over the entire period of an AC voltage signal, that particular form of this AC voltage signal which is free of any contamination.

The increase of the phase in the second graph from above in FIG. 4 is not continuous but discontinuous. The phase variation would be continuous except for the fact that after each new phase position again a jumping back to the reference phase occurs. The alternating measurement with a new phase and then again with the reference phase creates a sudden discontinuous alteration of the phase.

The method of phase modulation can also be applied when only a dc voltage is to be measured at the test subject 2. Then, for example, the track to be measured can be alternately switched back and forth between the dc voltage to be measured and 0 volts during the measurement. As a result thereof, just like in the method according to FIG. 4, the additional voltage C occurring as a result of contamination can be identified and subtracted from the measured curve.

The test spot 5 immediately adjacent to the particle beam probe 1 can also be buried below the surface 3. A conductive connection between the surface of the test spot 5 immediately adjacent to the particle beam probe 1 and the target surface of the particle beam probe 1 on the surface 3 can then be created via particle-hole excitations.

Although various minor changes and modifications might be proposed by those skilled in the art, it will be understood that we wish to include within the claims of the patent warranted hereon all such changes and modifications as reasonably come within our contribution to the art.

We claim as our invention:

1. A quantitive voltage potential measurement arrangement for use with a particle beam probe employed to measure a voltage potential on a test subject lying beneath and in direct contact with a layer and where the particle beam probe lies above a surface of the layer, comprising:

a test spot means comprising a solid state substance which has mobile charges, said test spot means being disposed in insulated fashion by said layer at said layer surface from and over said test subject and between said test subject and the particle beam probe such that the mobile charges in the test spot means are influenced by the potential on the test subject and a charge separation occurs of such mobile charges creating a potential at a surface of the test spot means facing the particle beam probe which is proportional to the voltage on the test subject, said proportional potential at the test spot means being achieved in that an area of the test spot means and the test subject are both large in comparison to a thickness of the layer beneath the test spot means so that a homogeneous electric field is present between the test spot means and the test subject when said proportional potential is present on the test spot means, and said surface potential being measured by the particle beam probe.

2. An arrangement according to claim 1 wherein the layer is an insulator and the test spot means is metallic and is disposed over the test subject and between the test subject and the particle beam probe.

3. An arrangement according to claim 1 wherein the test spot means having mobile charges lies on said layer surface.

4. An arrangement according to claim 1 wherein the test spot means having mobile charges is immediately next to the particle beam probe and is sufficiently large in order to avoid a disruptive, additional voltage building up thereon from the particle beam probe during the measurement.

5. A method for quantitative voltage measurement of a voltage potential on a test subject which is positioned beneath and in direct contact with a layer and where the particle beam probe is above the layer, comprising the steps of:

providing a test spot of a solid state substance which has mobile charges and which is positioned over the test subject at said layer surface and between the test subject and the particle beam probe;

selecting an area of the test spot and an area of the test subject sufficiently large in comparison to a thickness of the layer between the test spot and the test subject so that a homogeneous electric field is present beneath the test spot, and such that the surface potential resulting at the test spot is substantially proportional to the potential on the test subject; and with the particle beam probe, quantitatively measuring a potential on a surface of the test spot, the surface potential being created by an alignment of the mobile charges in the test spot which are influenced by the potential on the test subject.

6. A method according to claim 5 wherein a sum of charges from the particle beam striking the test spot and vicinity is approximately equal to a sum of charges leaving the test spot and vicinity.

7. A method according to claim 5 including the step of switching the potential at the test subject back and forth between the potential to be measured and a reference voltage, whereby disruptive influences can be eliminated from the test result.

* * * * *